(12) United States Patent
Kim et al.

(10) Patent No.: US 11,837,627 B2
(45) Date of Patent: Dec. 5, 2023

(54) DISPLAY APPARATUS, DISPLAY PANEL AND METHOD FOR MANUFACTURING THE SAME

(71) Applicant: LG Display Co., Ltd., Seoul (KR)

(72) Inventors: Ki-Tae Kim, Seoul (KR); So-Young Noh, Goyang-si (KR); Kyeong-Ju Moon, Paju-si (KR); Hyuk Ji, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 200 days.

(21) Appl. No.: 17/129,651

(22) Filed: Dec. 21, 2020

(65) Prior Publication Data

US 2021/0202568 A1 Jul. 1, 2021

(30) Foreign Application Priority Data

Dec. 31, 2019 (KR) ........................ 10-2019-0180031

(51) Int. Cl.
| | |
|---|---|
| H01L 27/15 | (2006.01) |
| H01L 33/62 | (2010.01) |
| H01L 33/12 | (2010.01) |
| H01L 33/38 | (2010.01) |
| H01L 33/00 | (2010.01) |
| H01L 33/54 | (2010.01) |

(52) U.S. Cl.
CPC .......... *H01L 27/156* (2013.01); *H01L 33/005* (2013.01); *H01L 33/12* (2013.01); *H01L 33/38* (2013.01); *H01L 33/54* (2013.01); *H01L 33/62* (2013.01); *H01L 2933/005* (2013.01); *H01L 2933/0016* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2017/0170206 A1* | 6/2017 | Lee | ...................... H01L 27/1218 |
| 2017/0256569 A1* | 9/2017 | Ohara | .................. H01L 29/4908 |
| 2018/0366586 A1* | 12/2018 | Son | ...................... H01L 27/1255 |
| 2019/0115407 A1* | 4/2019 | Cho | ...................... H01L 27/1262 |
| 2019/0245159 A1* | 8/2019 | Kim | ...................... H01L 51/5246 |
| 2019/0288048 A1* | 9/2019 | Kang | ................... G09G 3/3233 |

(Continued)

FOREIGN PATENT DOCUMENTS

KR 10-2018-0115387 A 10/2018

*Primary Examiner* — Mark W Tornow
*Assistant Examiner* — Priya M Rampersaud
(74) *Attorney, Agent, or Firm* — Fenwick & West LLP

(57) ABSTRACT

The present disclosure provides a display apparatus, a display panel and a method for manufacturing the same. The display panel includes a substrate including a display area including a plurality of sub-pixels, and a gate driving area including a gate driving circuit, a first buffer layer contacting the substrate in the gate driving area, a second thin film transistor disposed in the gate driving area while including a second semiconductor layer made of a second semiconductor, a second buffer layer disposed at a first opening exposing the substrate in the display area while contacting the substrate, and a first thin film transistor disposed at the first opening in the display area while including a first semiconductor layer made of a first semiconductor different from the second semiconductor.

19 Claims, 8 Drawing Sheets

(56) References Cited

U.S. PATENT DOCUMENTS

2020/0135935 A1* 4/2020 Yuan .................... H01L 29/4908
2020/0335524 A1* 10/2020 Lee ....................... H01L 27/124
2021/0202568 A1* 7/2021 Kim ..................... H01L 27/3262

* cited by examiner

DISPLAY APPARATUS, DISPLAY PANEL AND METHOD FOR MANUFACTURING THE SAME

CROSS-REFERENCE TO RELATED APPLICATION

This application claims the benefit of Republic of Korea Patent Application No. 10-2019-0180031 filed on Dec. 31, 2019, which is hereby incorporated by reference in its entirety.

BACKGROUND

Field of Technology

The present disclosure relates to a display apparatus, a display panel and a method for manufacturing the same, and more particularly to a display panel capable of securing desired transmissivity in a structure in which a camera is provided at a lower portion of the display panel.

Discussion of the Related Art

With the recent progress of information-dependent society, various kinds of display apparatuses have been developed. Among such display apparatuses, there is a display apparatus in which light emitting elements configured to emit light in a self-luminous manner are formed at a display panel under conditions that there is no backlight unit outside the display panel.

Such a display apparatus, in which light emitting elements are formed at a display panel, includes an array substrate defined with a plurality of pixels in a display area where an image is displayed. At least one thin film transistor is provided at each sub-pixel in each pixel.

For example, the array substrate includes, for each sub-pixel, a driving thin film transistor configured to supply driving current to a light emitting element, and a switching thin film transistor configured to supply a gate signal to the driving thin film transistor.

Meanwhile, in the array substrate of such a display apparatus, the driving thin film transistor should be designed to be advantageous in expression of grayscales, and the switching thin film transistor should be designed to be exhibit an excellent on/off ratio. When the driving thin film transistor exhibits reduced current variation with respect to voltage variation, the driving thin film transistor is advantageous in expression of grayscales. Meanwhile, the switching thin film transistor should be rapidly turned on/off.

However, the driving thin film transistor and the switching thin film transistor, which are disposed on the array substrate, include the same semiconductor material and, as such, have the same characteristics. For this reason, in such a conventional array substrate, there is a difficulty in designing the driving thin film transistor and the switching thin film transistor to have different characteristics.

Furthermore, when a plurality of transistors including different semiconductors is designed, a complex process may be required, and manufacturing costs may increase.

On the other hand, display apparatuses such as a smartphone, a notebook computer and an electronic book may be configured to be coupled to a camera and, as such, may perform not only display of a screen, but also checking, editing, etc. of a photographed image.

In connection with this, such a display apparatus is embodied in the form in which the camera is accommodated in a non-display area at a peripheral portion of a display panel. In this case, however, a bezel at the peripheral portion of the display panel may protrude due to a module configuration for driving the camera. Otherwise, the non-display area inevitably has an increased portion to be hidden. For this reason, the width and thickness of the bezel should increase and, as such, the entire structure of the display apparatus may be thickened, and this may be a factor that degrades the visual sense of the user. To this end, efforts have been made to solve such problems.

SUMMARY

In accordance with embodiments of the present disclosure, it is possible to enhance optical transmissivity of a camera area of a display area in a display panel through removal of a plurality of insulating layers disposed in the camera area even in a structure in which a camera is disposed in the display area. Accordingly, it may be possible to enhance recognizability of the camera disposed in the display area of the display panel. In addition, the camera is disposed to correspond to the display area and, as such, it may be possible to reduce a bezel area in a display apparatus.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display panel includes a substrate including a display area including a plurality of sub-pixels, and a gate driving area including a gate driving circuit, a first buffer layer contacting the substrate in the gate driving area, a second thin film transistor disposed in the gate driving area while including a second semiconductor layer made of a second semiconductor, a second buffer layer disposed at a first opening exposing the substrate in the display area while contacting the substrate, and a first thin film transistor disposed at the first opening in the display area while including a first semiconductor layer made of a first semiconductor different from the second semiconductor.

In another aspect of the present disclosure, a display panel includes a substrate including a display area including a plurality of sub-pixels, and a gate driving area including a gate driving circuit, a first buffer layer disposed in the gate driving area while contacting the substrate, a second thin film transistor disposed in the gate driving area, the second thin film transistor including a second semiconductor layer made of a polysilicon semiconductor, a second gate electrode overlapping with the second semiconductor layer under a condition that a first gate insulating layer is interposed between the second gate electrode and the second semiconductor layer, a second source electrode connected to the second semiconductor layer, and a second drain electrode connected to the second semiconductor layer, a first interlayer insulating layer disposed in the gate driving area while being disposed on the second gate electrode, a second buffer layer disposed in the gate driving area and the display area while contacting the substrate in the display area, and a first thin film transistor disposed in the display area, the first thin film transistor including a first semiconductor layer made of an oxide semiconductor, a first gate electrode overlapping with the first semiconductor layer under a condition that a second gate insulating layer is interposed between the first gate electrode and the first semiconductor layer, a first source electrode connected to the first semiconductor layer, and a first drain electrode connected to the first semiconductor layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
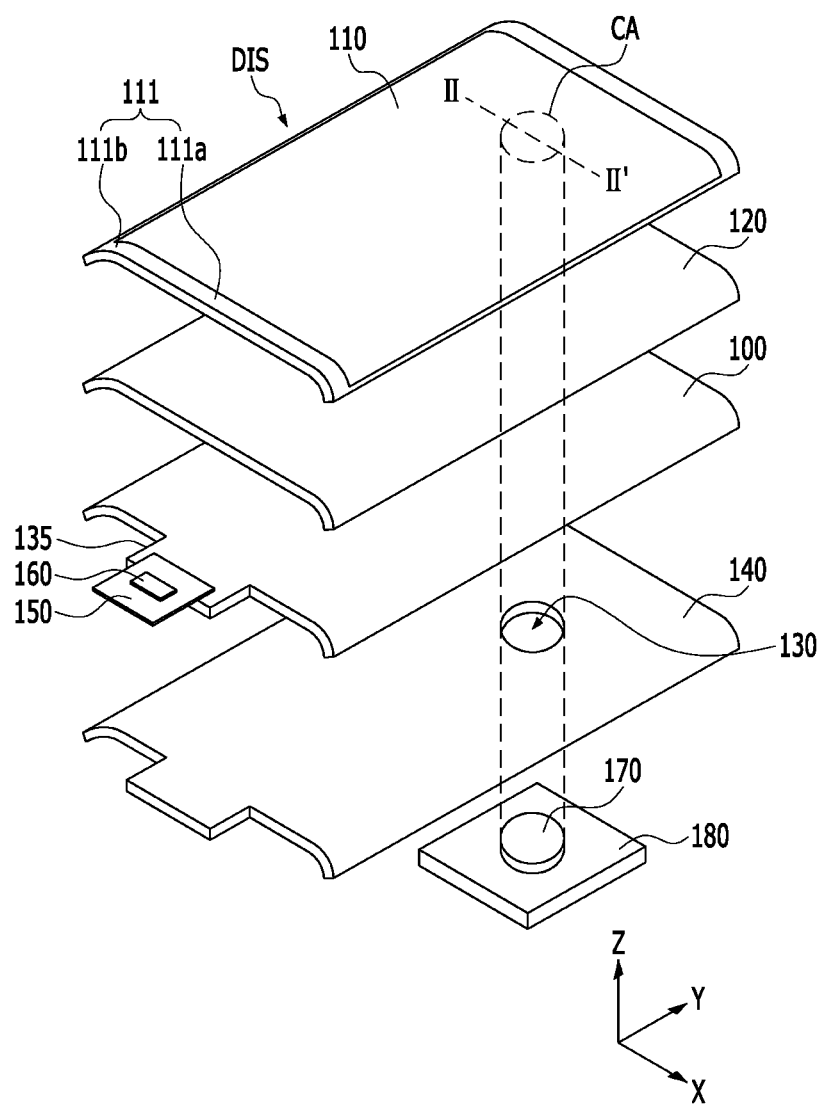
FIG. 1 is an exploded perspective view illustrating a display apparatus according to an exemplary embodiment of the present disclosure.

Hereinafter, embodiments of the present disclosure will be described in detail with reference to the accompanying illustrative drawings. In adding reference numerals for elements in each drawing, it should be noted that although the same constituent elements are shown in different drawings, the same reference numerals are used to denote the same constituent elements, wherever possible. In the following description, when the detailed description of the relevant known an is determined to unnecessarily obscure the subject matter the present disclosure, a detailed description thereof will be omitted. In the case where "comprise", "have", and "include" described in the present specification are used, another part may be added unless "only" is used. The terms of a singular form may include plural forms unless referred to the contrary. If the term, only is used, then it means no other parts or structures are present. The terms of a singular form may include plural forms unless clearly stated otherwise.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms.

It should be understood that, in describing a positional relationship, for example, when two or more elements are referred to as being "connected", "coupled" or "linked", one element may be "connected to", "coupled to" or "linked to" another element via a further element although one element may be directly connected to, directly coupled to or directly linked to another element. In this case, the further element may be included in at least one of the connected, coupled or linked two or more elements.

In describing a temporal relationship associated with an operating method, a manufacturing method, etc., for example, when a temporal order or a flow order is described as "after~", "subsequent to~", "next to~", and "before~", there may also be a non-continuous case unless "just" or "direct" is used.

Meanwhile, when a numerical value or information (for example, a level or the like) corresponding thereto is referred to for an element, the numerical value or the corresponding information may be construed as including a range of tolerance generated due to various factors (for example, process factors, internal or external impact, noise, etc.), even if there is no explicit description.

Figure 2:
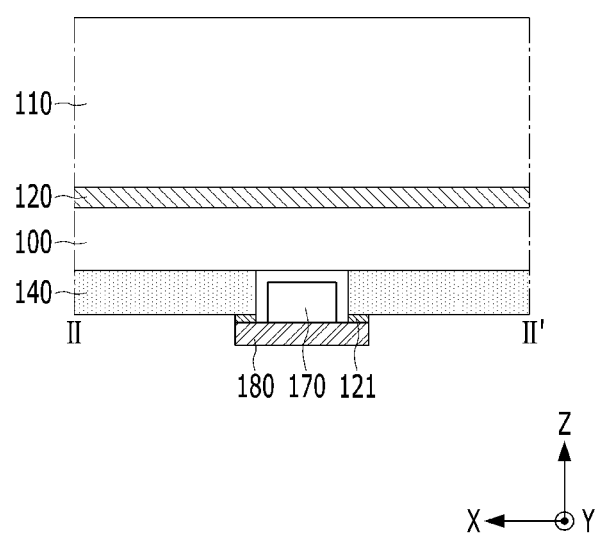
FIG. 2 is a cross-sectional view taken along line II-II' FIG. 1 according to an exemplary embodiment of the present disclosure.

FIG. 1 is an exploded perspective view illustrating a display apparatus according to an exemplary embodiment of the present disclosure. FIG. 2 is a cross-sectional view taken along line II-II' in FIG. 1 according to an exemplary embodiment of the present disclosure. That is, FIG. 2 is a cross-sectional view illustrating an example of the display apparatus in a camera area. Although FIG. 1 illustrates an example in which the display apparatus according to the exemplary embodiment of the present disclosure is formed into a curved display apparatus, embodiments of the present disclosure are not limited thereto.

The display apparatus according to the exemplary embodiment of the present disclosure may include a cover substrate 110, an adhesive film 120, a display panel 100, a heat dissipation film 140, a flexible film 150, an integrated controller 160, a camera 170, and a circuit hoard 180.

The cover substrate 110 may be made of plastic or glass. The cover substrate 110 may include a flat portion and a curved portion. The flat portion may be formed to be flat at a central portion of the cover substrate 110. The curved portion may be thrilled at one or more edges of the cover substrate 110 while having a first curvature. Although the curved portion is illustrated as being formed at opposite edges of the cover substrate 110 in FIG. 1, embodiments of the present disclosure are not limited thereto. For example, in embodiments of the present disclosure, the curved portion may be formed only at one edge of the cover substrate 110, or may be formed at three or four edges of the cover substrate 110. Alternatively, in embodiments of the present disclosure, the cover substrate 110 may include only the flat portion.

The cover substrate 110 may include a decorative layer 111. The decorative layer 111 may be a layer formed with a pattern visible to the user even when the display panel 100 does not display an image. The decorative layer 111 may include a character pattern 111a and a color layer 111b. The character pattern 111a may be a logotype of a company such as the logotype "LG". The color layer 111b may be formed in an area corresponding to a bezel area of the display panel 100. When the color layer 111b is formed to be black, the color layer 111b may be expressed by the same color as a display area of the display panel 110 when the display panel 100 does not display an image and, as such, the screen of the display panel 110 may be more widely visible to the user.

The adhesive film 120 is disposed at a back surface of the cover substrate 110. The adhesive film 120 functions to bond the cover substrate 110 and the display panel 100. The adhesive film 120 may be an optically clear resin (OCR) or an optically clear adhesive film (OCA film).

The display panel 110 may be disposed at the back surface of the cover substrate 110. The display panel may be disposed at the flat portion and the curved portion in the cover substrate 110. Since the display panel may be disposed even at the curved portion of the cover substrate 110, the user may view an image even through the curved portion of the cover substrate 110.

The display panel 100 may include a substrate 10. The substrate 10 may include a plastic film. The plastic film may be a polyimide film.

The display panel 100 may include a protrusion 135 extending from a portion of at least one side of the display panel 100. For example, as illustrated in FIG. 1, the protrusion 135 may be formed as a portion of one side of the display panel 100 extends outwards. The flexible film 150 may be attached to the protrusion 135. In order to reduce the bezel area of the display panel 110, the protrusion 135 and the flexible film 150 may be fixedly attached to the heat dissipation film 140 in a state of being bent toward a back surface of the display panel 100. The flexible film 150 may be formed in the form of a chip-on-film on which the integrated controller 60 is mounted.

The heat dissipation film 140 may be disposed at the back surface of the display panel 100. The heat dissipation film 140 may include a material having high thermal conductivity in order to effectively dissipate heat generated from the display panel 100. In addition, the heat dissipation film 140 may perform a shock absorbing function for protecting the display panel 100 from external impact. The heat dissipation film 140 may include a hole 130 formed to correspond to the camera area CA where the camera 170 is disposed. Referring to FIGS. 1 and 2, the heat dissipation film 140 may be removed at a portion thereof corresponding to the camera area CA where the camera 170 is disposed.

A support substrate may be additionally disposed between the display panel 100 and the heat dissipation film 140. The support substrate may be made of polyethylene terephthalate (PET).

The integrated controller 160 may be formed in the form of a chip such as an integrated circuit (IC), and may be attached to the flexible film 150 in a chip-on-film (COF) manner. The integrated controller 160 may be a driving circuit in which a data driving circuit, a timing control circuit, a power supply circuit, and a gamma voltage circuit are integrated.

Figure 3:
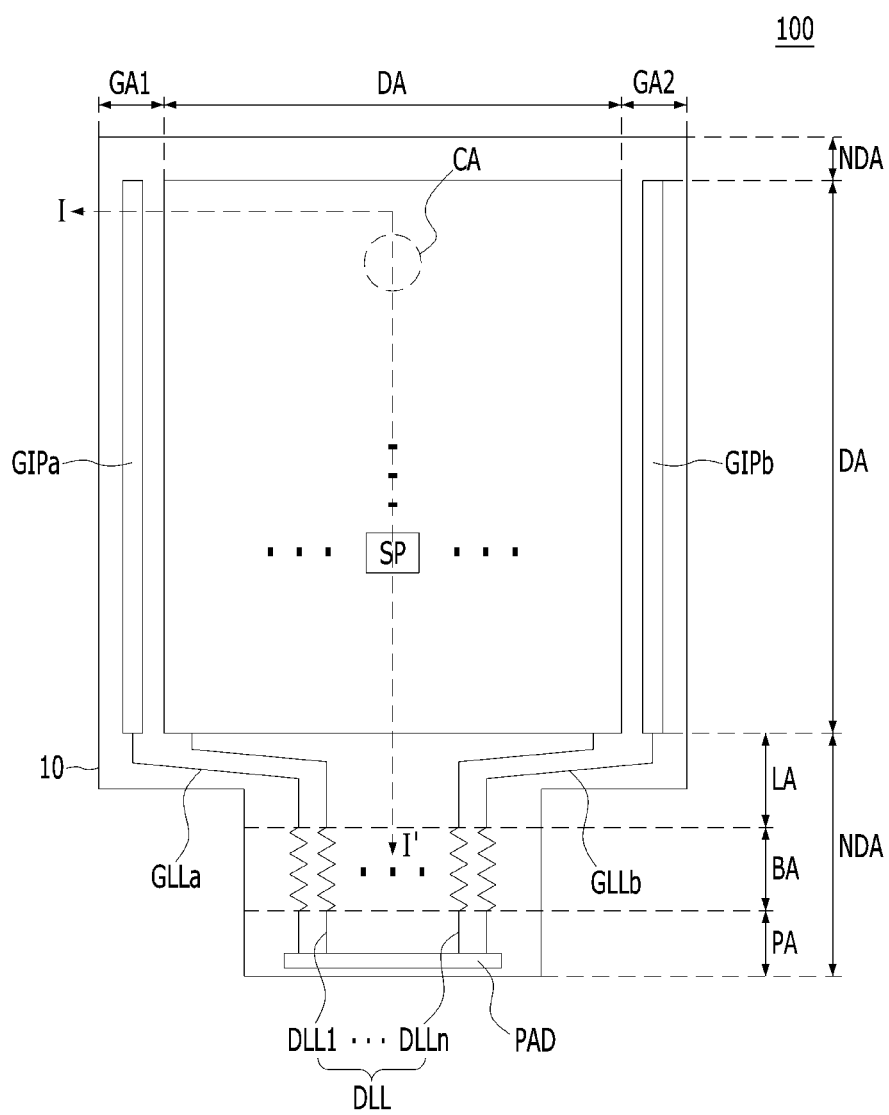
FIG. 3 is a schematic plan view of a display panel according to an embodiment of the present disclosure.

Referring to FIG. 3, the data driving circuit is connected to data lines and, as such, supplies data voltages to the data lines. The data driving circuit receives digital video data and a source timing control signal from the timing control circuit. The data driving circuit converts the digital video data into data voltages in accordance with the source timing control signal, and supplies the data voltages to the data lines.

The timing control circuit generates timing control signals for controlling operation timing of the data driving circuit and a gate driving circuit. The timing control signals may include a source timing control signal for controlling operation timing of the data driving circuit, and a scan timing control signal for controlling operation timing of the gate driving circuit.

The power supply circuit receives a main voltage from a battery of the display panel 100, generates a first supply voltage based on the main voltage, and supplies the first supply voltage to a first power line. Based on the main voltage, the power supply circuit also generates a second supply voltage, and supplies the second supply voltage to a second power line. In addition, the power supply circuit may supply driving voltages to the data driving circuit and the timing control circuit of the integrated controller 160, and a scan driver.

The gamma voltage circuit generates gamma voltages, and supplies the gamma voltages to the data driving circuit.

The camera 170 may be disposed at the back surface of the display panel 100 in the camera area CA.

As illustrated in FIG. 1, the camera 170 may be mounted on the circuit board 180. The circuit board 180 may be a printed circuit board (PCB) or a flexible PCB (FPCB). At least one edge of the circuit board 180 may be attached to a back surface of the heat dissipation film 140 by an adhesive layer 121, as illustrated in FIG. 2. In order to increase bonding force of the circuit board 180 to the heat dissipation film 140, all of four edges of the circuit board 180 may be attached to the back surface of the heat dissipation film 140 by the adhesive layer 121. The adhesive layer 121 may be an optically clear resin (OCR) or an optically clear adhesive film (OCA film).

When the circuit board 180 is attached to the back surface of the heat dissipation film 140 by the adhesive layer 121, the sum of heights of the heat dissipation film 140 and the adhesive layer 121 may be greater than the height of the camera 170. In this case, a gap may be formed between the camera 170 and the display panel 100. Accordingly, the camera 170 may be disposed on the back surface of the display panel 100 without being directly attached to the display panel 100. As such, it is unnecessary to directly attach the camera 170 to the back surface of the display panel 100 using an OCA film. Accordingly, it may be possible to reduce formation of a pressing trace due to pressing of an OCA film from being visible. When a support substrate is disposed between the display panel 100 and the heat dissipation film 140, a gap may be formed between the camera 170 and the support substrate.

As illustrated in FIGS. 1 and 2, the camera 170 is disposed in the hole 130 of the heat dissipation film 140 and, as such, optical transmissivity of the camera area CA of the display panel 100 may be enhanced.

FIG. 3 is a schematic plan view of a display panel according to each of embodiments of the present disclosure.

Referring to FIG. 3, the display panel according to each of the embodiments of the present disclosure, that is, the display panel 100, may include a display area DA configured to display information, and a non-display area NDA disposed adjacent to the display area DA. The display area DA may be an area in which an input image is displayed. A plurality of data lines and a plurality of gate lines are disposed in the display area DA. A plurality of sub-pixels SP connected to the plurality of data lines and the plurality of gate lines may also be arranged in the display area DA. In addition, the display area DA may include a camera area CA corresponding to the camera 170 disposed at the back surface of the display panel 100. On the other hand, the non-display area NDA may include a pad area PA where a pad part PAD is disposed, a bending area BA where the substrate 10 is bent, and a link area LA disposed between the bending area BA and the display area DA. The non-display area NDA may further include gate driving areas GA1 and GA2 (hereinafter simply referred to as "GA") where gate drivers GIPa and GIPb (hereinafter simply referred to as "GIP") of the gate driving circuit are disposed.

The plurality of data lines and the plurality of gate lines may be disposed in the display area DA of the display panel 100 while intersecting each other. For example, the plurality of data lines may be disposed in rows or columns. The plurality of gate lines may be disposed in columns or rows. The sub-pixels SP may be disposed in intersection areas of the data lines and the gate lines, respectively.

The gate driver GIP, which includes a gate driving circuit, may be disposed in the gate driving area GA. The gate driving circuit of the gate driver GIP sequentially supplies a scan signal to the plurality of gate lines and, as such, sequentially drives the plurality of gate lines, Here, the gate driving circuit is also referred to as a "scan driving circuit".

The gate driving circuit may include a shift register, a lever shifter, etc.

As in the display panel according to the exemplary embodiment of the present disclosure, the gate driving circuit is embodied to be of a gate-in-panel (GIP) type and, as such, may be directly disposed on the substrate 10. Alternatively, the gate driving circuit may be embodied in the form of a plurality of gate driver integrated circuits (G-DICs) and, as such, may be of a chip-on-film (COF) type in which the G-DICs are mounted on a gate circuit film connected to the substrate 10.

The gate driver GIP including the gate driving circuit sequentially supplies a scan signal of an ON voltage or an OFF voltage to the plurality of gate lines.

Although not shown in FIG. 3, the display panel 100 may further include a data driving circuit. When a particular one of the gate lines is opened by the gate driver GIP including the gate driving circuit, the data driving circuit converts image data DATA into a data voltage having an analog form, and supplies the data voltage to the plurality of data lines.

The data driving circuit may be disposed only at one side (for example, an upper side or a lower side) of the substrate. For example, the data driving circuit may be disposed in the pad area PA. In another example, the data driving circuit may be disposed at both sides (for example, upper and lower sides) of the substrate 10 in accordance with a driving method, a panel design method, etc.

The plurality of gate lines disposed at the substrate 10 may include a plurality of scan lines, a plurality of emission control lines, etc. The plurality of scan lines and the plurality of emission control lines are lines configured to transmit different kinds of gate signals (scan signals and emission control signals) to gate nodes of different kinds of transistors (scan transistors and emission control transistors).

The gate driver GIP including the gate driving circuit may include a scan driving circuit configured to output scan signals to the plurality of scan lines which is one kind of the gate and an emission driving circuit configured to output emission control signals to the plurality of emission control lines which is another kind of the gate lines.

The link area y be disposed between the display area DA and the bezel BA. The link area LA is an area where link lines configured to transmit signals to lines disposed in the display area DA and, as such, various link lines may be disposed in the link area LA. For example, gate link lines GLLa and GLLb (hereinafter simply referred to as "GLL"), data link lines DLL (e.g., DLL1 to DLLn), etc. may be disposed in the link area LA. In addition, the link lines may extend to the bending area BA and the pad are PA, and may be connected to pads PAD in the pad area PA, respectively.

The bending area BA may be an area where the substrate 10 is bent. The bending area BA may be disposed between the link area LA and the pad area PA. The substrate 10 may be configured to be maintained in a flat state without being bent in an area except for the bending area BA, and to be bent in the bending area BA. As such, the display apparatus 100 may be bent such that portions of the substrate 10 disposed in two non-bending areas except for the bending area BA of the substrate 10 face each other.

The pad area PA may be an area where no image is displayed, and a plurality of pads is formed. The pad area PA may be an area extending from one side of the bending area BA. The pad area PA may be an area where the pads PAD are disposed. For example, the pad area PA may be an area where high-level voltage (Vdd) supply pads, data pads, gate pads, and low-level voltage (Vss) supply pads are disposed.

Figure 4:
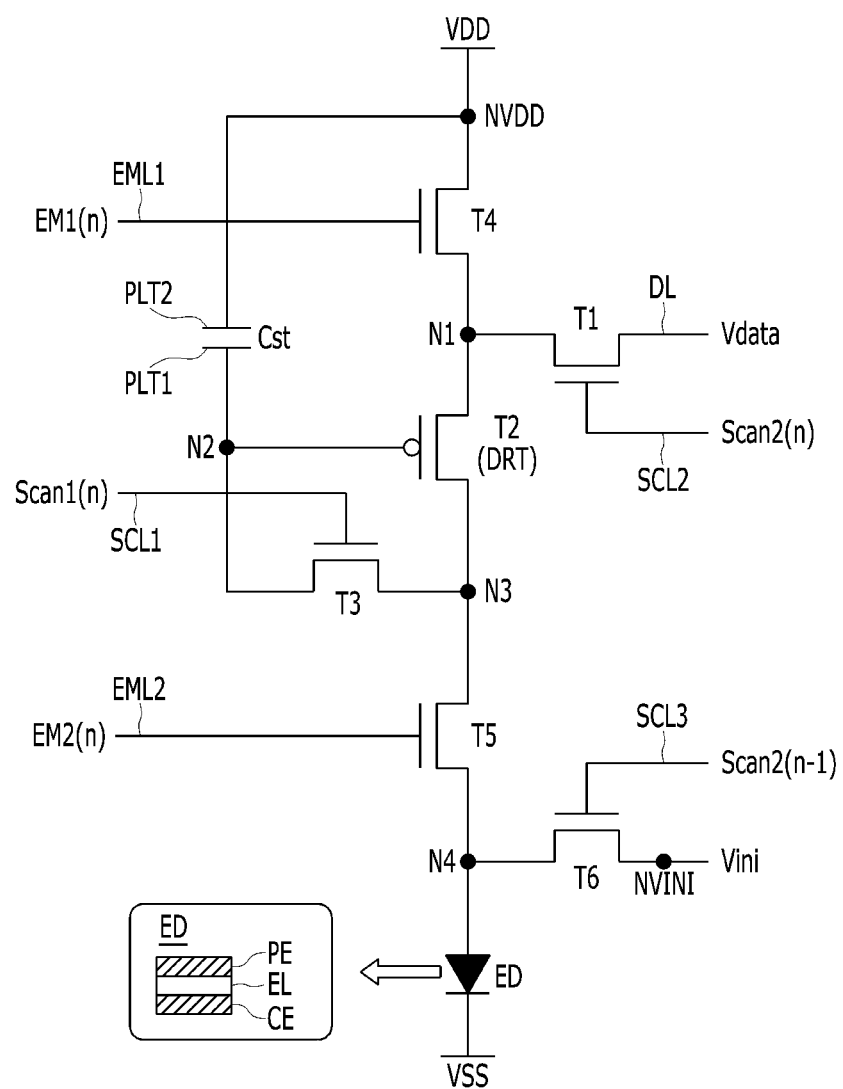
FIG. 4 is an equivalent circuit diagram of sub-pixel in a display panel according to an embodiment of the present disclosure.

FIG. 4 is an equivalent circuit diagram of each sub-pixel in a display panel according to each of embodiments of the present disclosure.

Referring to FIG. 4, each sub-pixel SP may include a light emitting element ED, first to sixth transistors T1 to T6, and a storage capacitor Cst.

Referring to FIG. 4, each sub-pixel SP may include main nodes including a first node N1 corresponding to a source node or a drain node in a second transistor T2, a second node N2 corresponding to a gate node of the second transistor T2, a third node N3 corresponding to the drain node or the source node in the second transistor T2, and a fourth node N4 corresponding to a pixel electrode PE of the light emitting element ED.

The light emitting element ED may include a pixel electrode PE, a light emitting layer EL, and a common electrode CE. The light emitting layer EL is disposed between the pixel electrode PE and the common electrode CE. The pixel electrode PE and the light emitting layer EL are disposed at each sub-pixel SP. On the other hand, the common electrode CE may be disposed in common at a plurality of sub-pixels SP. A ground voltage VSS corresponding to a common voltage may be applied to the common electrode CE.

Among the first to sixth transistors T1 to T6, the second transistor T2 is a driving transistor DRT configured to drive the light emitting element ED.

For the remaining five transistors T1, T3, T4, T5 and T6, among the first to sixth transistors T1 to T6, except for the second transistor T2, which is the driving transistor DRT, five different gate lines GL to be connected to respective gate nodes of the five transistors T1, T3, T4, T5 and T6 are required.

The five different gate lines GL may include first to third scan lines SCL1, SCL2 and SCL3, and first and second emission control lines EML1 and EML2.

The third transistor T3 controls electrical connection between the second node N2 and the third node N3 in accordance with a first scan signal Scan1($n$) applied to the gate node of the third transistor T3 through the first scan line SCL1.

The first transistor T1 controls electrical connection between the first node N1 and the data line DL to supply a data voltage Vdata, in accordance with a second scan signal Scan2($n$) applied to the gate node of the first transistor T1 through the second scan line SCL2.

The sixth transistor T6 controls electrical connection between the fourth node N4 and an initialization voltage node NVINI, to which an initialization voltage Vini is applied, in accordance with a third scan signal Scan3($n$) applied to the gate node of the sixth transistor T6 through the third scan line SCL3.

The fourth transistor T4 controls electrical connection between the first node N1 and a driving voltage node NVDD, to which a driving voltage VDD is applied, in accordance with a first emission control signal EM1($n$) applied to the gate node of the fourth transistor T4 through the first emission control line EML1.

The fifth transistor T5 controls electrical connection between the third node N3 and the fourth node N4 in accordance with a second emission control signal EM2($n$) applied to the gate node of the fifth transistor T5 through the second emission control line EML2.

Referring to FIG. 4, the storage capacitor Cst includes a first plate PLT1 and a second plate PLT2. The first plate PLT1 is electrically connected to the gate node of the second transistor T2 which is the driving transistor DRT. The second plate PLT2 is electrically connected to a DC voltage node. Here, the DC voltage node may include, for example, the driving voltage node NVDD.

Referring to FIG. 4, the storage capacitor CST may be electrically connected between the second node N2 and the driving voltage node NVDD. Here, the second node N2 may correspond to the gate node of the second transistor T2 which is the driving transistor DRT, and the driving voltage node NVDD may be the DC voltage node.

Referring to FIG. 4, among the first to sixth transistors T1 to T6, the second transistor T2 may be a P-type transistor. For example, among the first to sixth transistors T1 to T6, the second transistor T2 may be a P-type transistor, and the remaining transistors, that is, the first transistor T1 and the third to sixth transistors T3 to T6, may be N-type transistors. Of course, embodiments of the present disclosure are not limited to the above-described conditions, and at least one of the first to sixth transistors T1 to T6 may be an N-type transistor, and the remaining transistors may be P-type transistors. Alternatively, all of the first to sixth transistors T1 to T6 may be N-type transistors.

As the second transistor T2, which is the driving transistor DRT, is designed to be a P-type transistor, as described above, the storage capacitor Cst may be formed between the gate node of the second transistor T2, that is, the second node N2, and the DC voltage node, that is, the driving voltage node NVDD.

As one of both ends of the storage capacitor Cst is connected to the driving voltage node NVDD, which is the DC voltage node, it may be possible to prevent voltage variation at the other end of the storage capacitor Cst, that is, the second node N2. The second node N2 corresponds to the gate node of the second transistor T2 which is the driving transistor DRT.

In addition, in accordance with embodiments of the present disclosure, the second transistor T2, which is the driving transistor DRT, is designed to be a P-type transistor that is advantageous in terms of operation reliability and current supply performance because operation reliability and current supply performance are most important. However, the remaining transistors, that is, the first transistor T1 and the third to sixth transistors T3 to T6, may be transistors in which switching speed is more important than current supply performance. Accordingly, the first transistor T1 and the third to sixth transistors T3 to T6 may be designed to be N-type transistors having a rapid switching speed by virtue of high carrier mobility. As such, driving performance of the sub-pixel SP may be greatly enhanced.

Meanwhile, the display apparatus according to each embodiment of the present disclosure may be a self-luminous display such as an organic light emitting diode (OLED) display, a quantum dot display, or a micro light emitting diode (LED) display.

When the display apparatus according to each embodiment of the present disclosure is an OLED display, each sub-pixel SP of the display panel 100 may include an OLED, which emits light in a self-luminous manner, as the light emitting element ED thereof. When the display apparatus according to each embodiment of the present disclosure is a quantum dot display, each sub-pixel SP of the display panel 100 may include a light emitting element ED made of quantum dots, which are semiconductor crystals emitting light in a self-luminous manner. When the display apparatus according to each embodiment of the present disclosure is a micro LED display, each sub-pixel SP of the display panel 100 may include a micro LED, which emits light in a self-luminous manner, and is made of an inorganic substance-based material, as the light emitting element ED thereof.

Although each sub-pixel SP in the present disclosure has been described as including the light emitting element ED, the first to sixth transistors T1 to T6, and the storage capacitor Cst, as in FIG. 4, embodiments of the present disclosure are not limited thereto. For example, in accordance with an embodiment of the present disclosure, each sub-pixel SP may include a light emitting element ED, first to seventh transistors T1 to T7, a storage capacitor Cst, etc.

Figure 5:
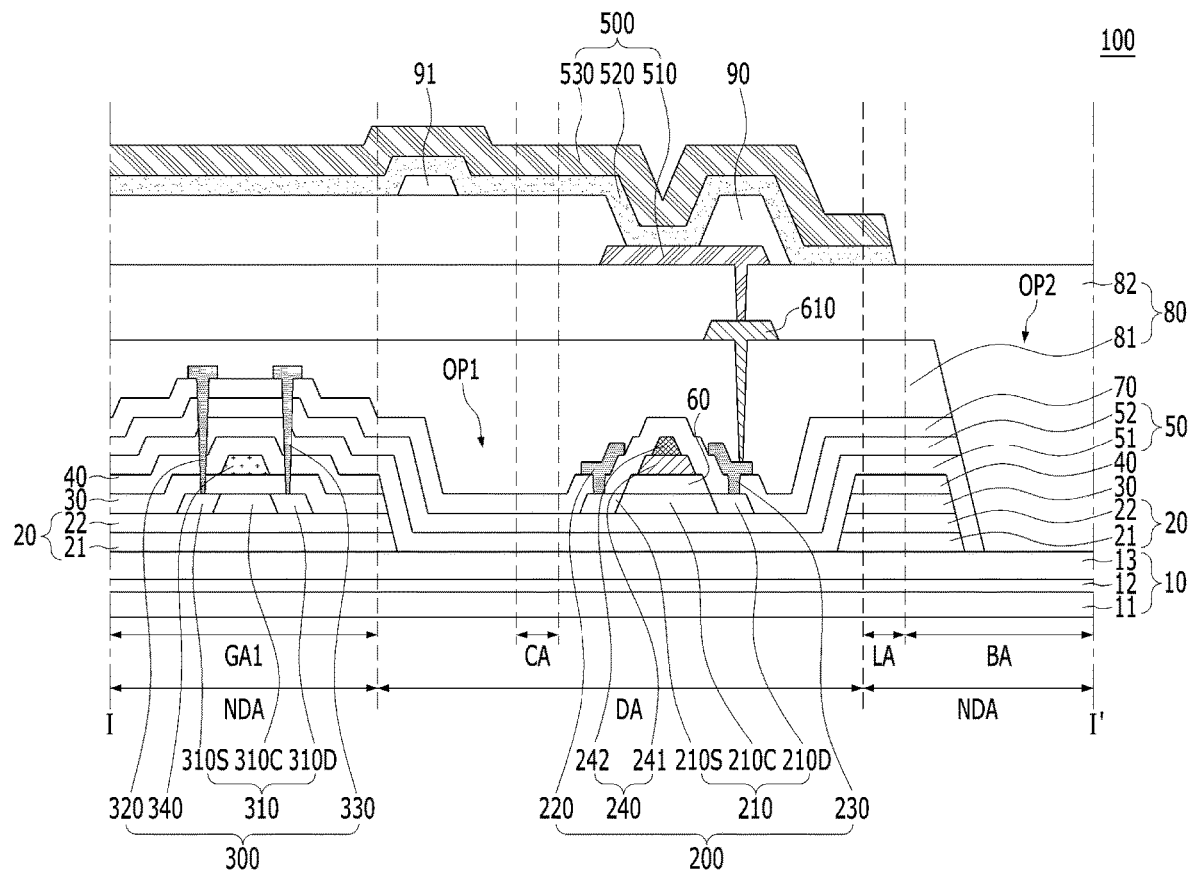
FIG. 5 is a view illustrating a cross-sectional structure taken along line I-I' in FIG. 3 according to an exemplary embodiment of the present disclosure.

FIG. 5 is a view illustrating a cross-sectional structure taken along line I-I' in FIG. 3 according to one embodiment. FIGS. 6A to 6F are cross-sectional views illustrating a formation process for a display panel 100 according to an exemplary embodiment of the present disclosure. The display panel 100 according to the exemplary embodiment of the present disclosure will be described in detail with reference to FIG. 5 and FIGS. 6A to 6F.

Referring to FIG. 5, the display panel 100 according to the exemplary embodiment of the present disclosure may include a substrate 10, a first buffer layer 20, a first gate insulating layer 30, a first interlayer insulating layer 40, a second buffer layer 50, a second gate insulating layer 60, a second interlayer insulating layer 70, a passivation layer 80, a bank layer 90, a spacer 91, a light emitting element 500, a first thin film transistor 200, a second thin film transistor 300, and an auxiliary electrode 610.

The first thin film transistor 200 may include a first semiconductor layer 210 including a first semiconductor material, a first source electrode 220, a first drain electrode 230, and a first gate electrode 240. The second thin film transistor 300 may include a second semiconductor layer 310 including a second semiconductor material different from the first semiconductor material, a second source electrode 320, a second drain electrode 330, and a second gate electrode 340. For example, the first semiconductor material may be an oxide semiconductor, whereas the second semiconductor material may a polysilicon (poly-Si) semiconductor.

The second thin film transistor 300, which includes the second semiconductor material, may be disposed in a gate driving area GA of a non-display area NDA. The first thin film transistor 200, which includes the first semiconductor material different from the second semiconductor material, may be disposed at the sub-pixel SP in the display area DA. For example, the second thin film transistor 300, which includes a poly-silicon semiconductor, may be disposed in a first gate driving area GA1 of a non-display area NDA. The first thin film transistor 200, which includes an oxide semiconductor, may be disposed at the sub-pixel SP in the display area DA.

Referring to FIG. 5, the display panel 100 may include the substrate 10. The substrate 10 may include the display area DA, in which a plurality of sub-pixels SP is disposed, and the non-display area NDA, which is disposed adjacent to the display area DA. The display area DA may include a camera area CA corresponding to a camera 170 disposed at a back surface of the substrate 10. Here, "back surface" means a lower surface of the substrate 10 when viewed in a cross-sectional view of FIG. 5. In addition, as illustrated in FIG. 5, the non-display area NDA may include a bending area BA where the substrate 10 is bent, and a link area LA disposed between the bending area BA and the display area DA. The non-display area NDA may further include a gate driving area GA in which a gate driver GIP of a gate driving circuit is disposed. The gate driving area GA may include a first gate driving area GA1 disposed at one side of the substrate 10, and a second gate driving area GA2 disposed at the other side of the substrate 109.

The substrate 10 may be constituted by double polyimide (PI) in order to prevent degradation in performance of the display apparatus caused by moisture penetration. In this case, an inorganic insulating layer may be formed between two polyimide (PI) layers and, as such, it may be possible to prevent moisture components from passing through the lower polyimide (PI) layer, thereby achieving an enhancement in performance reliability of the resultant product.

As the substrate 10 is formed through disposal of an inorganic film between two polyimide (PI) layers, it may be possible to reduce the influence of electric charges charged in the substrate 10 on the first thin film transistor 200 and, as such, reliability of the resultant product may be enhanced. In addition, it may be possible to omit a process for forming a metal layer in order to block electric charges charged in the polyimide (PI) and, as such, process simplification and a reduction in manufacturing costs may be achieved.

The display panel 100 according to the exemplary embodiment of the present disclosure may realize a display apparatus capable of securing desired environmental reliability, through use of double polyimide (PI) for the substrate. For example, the substrate 10 of the display panel 100 may include a first substrate 11, a second substrate 13, and an inorganic insulating layer 12 formed between the first substrate 11 and the second substrate 13. The inorganic insulating layer 12 may perform a function for preventing electric charges from having influence on the first thin film transistor 200 via the second substrate 13. In addition, the organic insulating layer 12 formed between the first substrate 11 and the second substrate 13 may perform a function for preventing moisture components from penetrating through the first substrate 11.

Each of the first substrate 11 and the second substrate 13 may be a layer made of plastic such as polyimide (PI). The inorganic insulating layer 12 may be constituted by a single layer made of silicon nitride ($SiN_x$) or silicon oxide ($SiO_x$) or multiple layers thereof. For example, the inorganic insulating layer 12 may be made of silica or silicon dioxide ($SiO_2$). Of course, embodiments of the present disclosure are not limited to the above-described conditions, and the inorganic insulating layer 12 may be formed by double layers of silicon dioxide ($SiO_2$) and silicon nitride ($SiN_x$).

The substrate 10 may include sub-pixels SP defined by gate lines and data lines. The first thin film transistor 200 and the light emitting element 500 may be disposed at each sub-pixel SP. The emitting element 500 of each sub-pixel SP may extend even to the non-display area NDA. For example, a light emitting layer 520 and a second electrode 530 in the light emitting element 500 disposed in the display area DA may extend to be disposed even in the gate driving area GA or the bending area BA of the non-display area NDA.

In addition, the light emitting element 500 may be electrically connected to the first thin film transistor 200 in the corresponding sub-pixel SP disposed in the display area DA and, as such, may emit light of a particular color. Alternatively, the light emitting element 500 may be electrically connected to the second thin film transistor 300 and, as such, may emit light of a particular color.

Referring to FIG. 5, the first buffer layer 20 may be formed on the substrate 10. The first buffer layer 20 may reduce contamination caused by the substrate 10 in a process for forming pixel circuits. For example, the first buffer layer 20 may be formed between the substrate 10 and the first semiconductor layer 210 of each sub-pixel SP. The first buffer layer 20 may include an insulating material. For example, the first buffer layer 20 may include a silicon oxide ($SiO_x$)-based material layer and a silicon nitride ($SiN_x$)-based material layer. The first buffer layer 20 may have a multilayer structure. For example, the first buffer layer 20 may include a first-buffer lower layer 21 and a first buffer upper layer 22.

The first-buffer lower layer 21 may be disposed on the substrate 10. The first-buffer upper layer 22 may be disposed on the first-buffer lower layer 21. The first-buffer lower layer 21 may be formed by a multilayer structure constituted by a silicon nitride ($SiN_x$)-based material layer and a silicon oxide ($SiO_x$)-based material layer. For example, the first-buffer lower layer 21 may be formed by a multilayer structure in which a silicon oxide ($SiO_x$) layer and a silicon nitride ($SiN_x$) layer are alternately stacked.

On the other hand, the first-buffer upper layer 22 may be formed by a single layer made of a silicon oxide ($SiO_x$)-based material. For example, the first-buffer upper layer 22 may be formed by a single layer made of silicon dioxide ($SiO_2$).

The second semiconductor layer 310 of the second thin film transistor 300 may be disposed on the first-buffer upper layer 22 of the first buffer layer 20.

Referring to FIG. 5, the second semiconductor layer 310 of the second thin film transistor 300 may be disposed on the first-buffer upper layer 22. The second semiconductor layer 310 may include a semiconductor material. For example, the second semiconductor layer 310 may include polysilicon (poly-Si) which is a polycrystalline semiconductor material. For example, the second semiconductor layer 310 may include low-temperature polysilicon (LTPS).

The second semiconductor layer 310 may include a second channel region 310C, a second source region 310S, and a second drain region 310D. The second semiconductor layer 310 of the second thin film transistor 300 may be disposed in the non-display area NDA. For example, the second semiconductor layer 310 of the second thin film transistor 300 may be disposed in the gate driving area GA of the non-display area NDA. As illustrated in FIG. 5, the second semiconductor layer 310 may be disposed in the first gate driving area GA1 of the gate driving area GA.

The first gate insulating layer 30 may be formed on the second semiconductor layer 310 and the first buffer layer 20. The first gate insulating layer 30 may include an insulating material. For example, the first gate insulating layer 30 may include a silicon oxide ($SiO_x$)-based material. For example, the first gate insulating layer 30 may include silicon dioxide ($SiO_2$) as the silicon oxide ($SiO_x$)-based material thereof. Of course, embodiments of the present disclosure are not limited to the above-described conditions, and the first gate insulating layer 30 may include a silicon nitride ($SiN_x$)-based material. Alternatively, the first gate insulating layer 30 may be formed by multiple layers constituted by a silicon nitride ($SiN_x$)-based material layer and a silicon oxide ($SiO_x$)-based material layer.

The second gate electrode 340 of the second thin film transistor 300 may be formed on the first gate insulating layer 30.

The second gate electrode 340 may overlap with the second semiconductor layer 310 under the condition that the first gate insulating layer 30 is interposed between the second gate electrode 340 and the second semiconductor layer 310. For example, the second gate electrode 340 may overlap with the second channel region 310E of the second semiconductor layer 310 under the condition in which the first gate insulating layer 30 is interposed between the second gate electrode 340 and the second channel region 310C. In addition, the second gate electrode 340 may be disposed in the non-display area. NDA. For example, the second gate electrode 340 may be disposed in the gate driving area GA of the non-display are NDA.

The second gate electrode 340 may include a conductive material. For example, the second gate electrode 340 may include metal such as aluminum (Al), chromium (Cr), copper (Cu), titanium (Ti), molybdenum (Mo), tungsten (W), or an alloy thereof. The second gate electrode 340 may be formed by a single layer made of metal or an alloy, or multiple layers thereof.

Figure 6A:
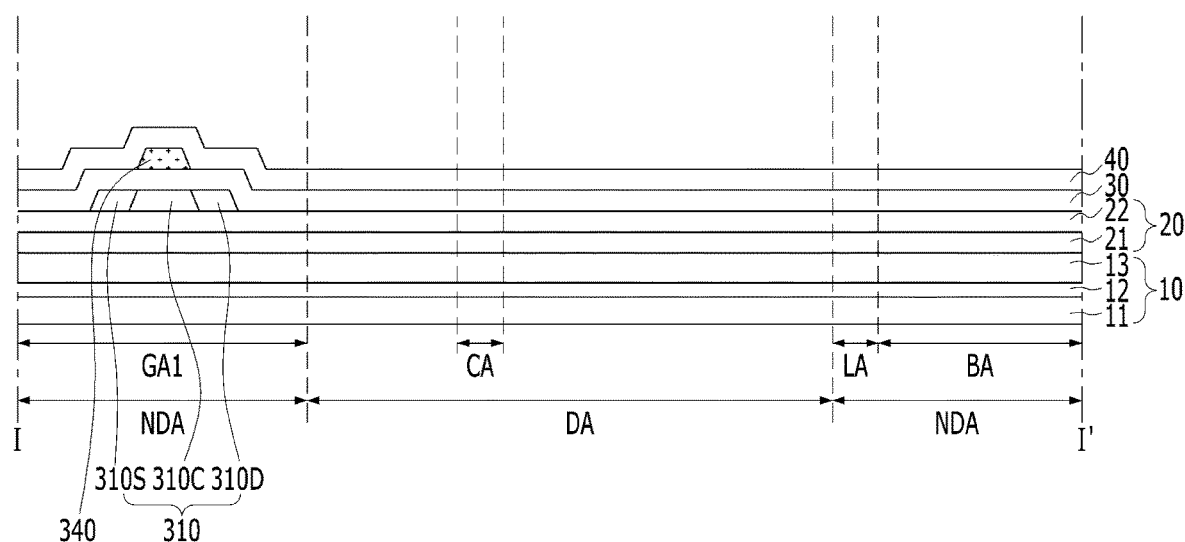
FIGS. 6A to 6F are cross-sectional views illustrating a formation process for a display panel according to an exemplary embodiment of the present disclosure.

Referring to FIGS. 5 and 6A, the first interlayer insulating layer 40 may be formed on the second gate electrode 340 and the first gate insulating layer 30. The first interlayer insulating film 40 may include an insulating material. The first interlayer insulating layer 40 may be a single layer constituted by a silicon oxide ($SiO_x$)-based material layer or a silicon nitride ($SiN_x$)-based material layer. Although the first interlayer insulating layer 40 is illustrated as a single layer in the exemplary embodiment of the present disclosure, embodiments of the present disclosure are not limited thereto. Alternatively, the first interlayer insulating layer 40 may have a multilayer structure constituted by a silicon oxide ($SiO_x$)-based material layer or a silicon nitride ($SiN_x$)-based material lave. For example, when the first interlayer insulating layer 40 has a multilayer structure, the first interlayer insulating layer 40 may include a first-interlayer-insulating lower layer and a first-interlayer-insulating upper layer. The first-interlayer-insulating lower layer may include the same insulating layer as the first gate insulating layer 30. On the other hand, the first-interlayer-insulating upper layer may include an insulating material different from that of the first interlayer-insulating lower layer. For example, when the first gate insulating layer 30 includes a silicon oxide ($SiO_x$)-based material, the first-interlayer-insulating lower layer may include a silicon oxide ($SiO_x$)-based material. In this case, the first-interlayer-insulating upper layer may include a silicon nitride ($SiN_x$)-based material.

Figure 6B:
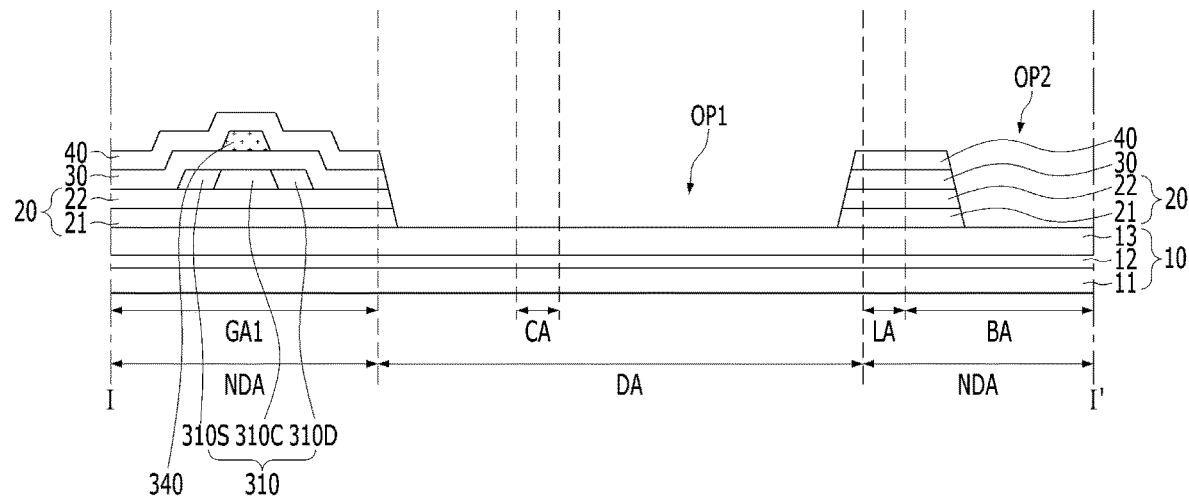

Referring to FIGS. 5 and 6B, a first opening OP1 and a second opening OP2 may be formed to expose the substrate 10 by etching the first interlayer insulating layer 40, the first gate insulating layer 30, and the first buffer layer 20. For example, the first opening OP1, which exposes the second substrate 13 of the substrate 10, may be formed by etching the first interlayer insulating layer 40, the first gate insulating layer 30 and the first buffer layer 20 which are disposed in the display area DA. In addition, the second opening OP2, which exposes the second substrate 13 of the substrate 10, may be formed by etching the first interlayer insulating layer 40, the first gate insulating layer 30 and the first buffer layer 20 which are disposed in the bending area BA of the non-display area NDA.

Accordingly, the first opening OP1 exposing the substrate 10 may be formed through etching of the first interlayer insulating layer 40, the first gate insulating layer 30 and the first buffer layer 20 in the display area DA. In addition, the second opening OP2 exposing the substrate 10, may be formed through etching of the first interlayer insulating layer 40, the first gate insulating layer 30 and the first buffer layer 20 in the bending area BA of the non-display area NDA.

As illustrated in FIGS. 5 and 6B, it may be possible to enhance optical transmissivity of the camera area CA by removing the first interlayer insulating layer 40, the first gate insulating layer 30 and the first buffer layer 20 disposed in the display area DA through an etching process. In addition, for an enhancement in optical transmissivity of the camera area CA, the etching process for formation of the fist opening OP1 exposing the substrate 10 in the display area DA is carried out simultaneously with the etching process for formation of the second opening OP2 exposing the substrate 10 in the bending area BA of the non-display area NDA, without being separately carried out. Accordingly, the manufacturing process for the display panel may be simplified. As such, the manufacturing time and costs of the display panel may be reduced.

In addition, in accordance with removal of a plurality of insulating layers disposed in the display area DA, it may be possible to enhance optical transmissivity of the camera area CA corresponding to the camera 170 disposed at the back surface of the display panel 100. For example, as illustrated in FIG. 5, the first interlayer insulating layer 40, the first gate insulating layer 30 and the first buffer layer 20 disposed in the display area DA are removed through an etching process and, as such, the first opening OP1 exposing the substrate 10 may be formed. Accordingly, the first thin film transistor 200 may be disposed on the substrate 10 exposed through the first opening OP1.

Figure 6C:
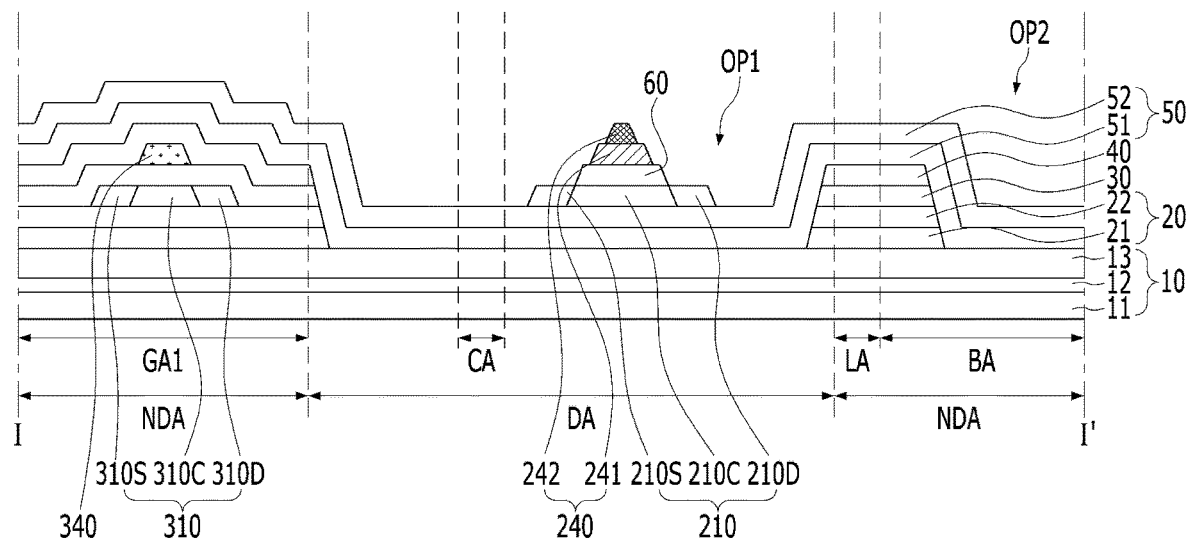

Referring to FIG. 6C, the second buffer layer 50 may be formed on the first interlayer insulating layer 40 and the substrate 10 exposed through the first opening OP1 and the second opening OP2. For example, the second buffer layer 50 disposed in the gate driving area GA may contact the first interlayer insulating layer 40. In addition, the second buffer layer 50 disposed in the display area DA may contact the substrate 10. Furthermore, the second buffer layer 50 disposed in the bending area BA may contact the substrate 10. As illustrated in FIG. 6C, the second buffer layer 50 disposed in the display area DA and the bending area BA of the non-display area NDA may contact the substrate 10 exposed through the first opening OP1 and the second opening OP2. In addition, the second buffer layer 50 disposed in the gate driving area GA may contact the first interlayer insulating layer 40 disposed on the second gate electrode 340.

The second buffer layer 50 may be formed by multiple layers constituted by a silicon nitride ($SiN_x$)-based material layer and a silicon oxide ($SiO_x$)-based material layer. The second buffer layer 50 may be formed to have a multilayer structure in which a silicon oxide ($SiO_x$) layer and a silicon nitride ($SiN_x$) layer are alternately formed. For example, the second buffer layer 50 may include a second-buffer lower layer 51 disposed on the first interlayer insulating layer 40, and a second-buffer upper layer 52 disposed on the second-buffer lower layer 51. The second-buffer lower layer 51 may include silicon nitride ($SiN_x$), whereas the second-buffer upper layer 52 may include silicon oxide ($SiO_x$). The thickness of the second-buffer upper layer 52 may be greater than the thickness of the second-buffer lower layer 51. As the thickness of the second-buffer upper layer 52 including silicon oxide ($SiO_x$) is greater than the thickness of the second-buffer lower layer 51 including silicon nitride ($SiN_x$), it may be possible to prevent hydrogen (H) produced or discharged front the second-buffer lower layer 51 from being introduced into the first semiconductor layer 210 of the first thin film transistor 200.

Referring to FIG. 6C, the second buffer layer 50 may be formed on the first interlayer insulating layer 40 and the substrate 10 exposed through the first opening OP1 and the second opening OP2. For example, the second-buffer lower layer 51 may be formed on the first interlayer insulating layer 40 and the substrate 10 exposed through the first opening OP1 and the second opening OP2. In this case, the second-buffer lower layer 51 may contact the substrate 10 exposed through the first opening OP1 and the second opening OP2. In addition, the second-buffer upper layer 52 may be formed on the second-buffer lower layer 51. The second-buffer lower layer 51 disposed in the gate driving area GA may contact the first interlayer insulating layer 40 disposed on the second gate electrode 340. In addition, the second-buffer upper layer 51 may be disposed on the second-buffer lower layer 51.

In addition, the first semiconductor layer 210 of the first thin film transistor 200 may be disposed on the second-buffer upper layer 52 of the second buffer layer 50. The first semiconductor layer 210 of the first thin film transistor 200 may include a material different from that of the second semiconductor layer 310 of the second thin film transistor 300. In addition, the first semiconductor layer 210 of the first thin film transistor 200 may be disposed in the display area DA.

Referring to FIGS. 5 and 6C, among the plurality of insulating layers, only the second buffer layer 50 is disposed between the first semiconductor layer 210 of the first thin film transistor 200 and the substrate 10 in the display area DA.

The first semiconductor layer 210 may include an oxide semiconductor. For example, the first semiconductor layer 210 may include at least one of an IZO (InZnO)-based oxide semiconductor material, an IGO (InGaO)-based oxide semiconductor material, an ITO (InSnO)-based oxide semiconductor material, an IGZO (InGaZnO)-based oxide semiconductor material, an IGZTO (InGaZnSnO)-based oxide semiconductor material, an ITZO (InSnZnO)-based oxide semiconductor material, an IGTO (InGaSnO)-based oxide semiconductor material, a GO (GaO)-based oxide semiconductor material, a GZTO (GaZnSnO)-based oxide semiconductor material, or a GZO (GaZnO)-based oxide semiconductor material. Of course, embodiments of the present disclosure are not limited to the above-described condition, and the first semiconductor layer 210 may be made of another oxide semiconductor material known in the art to which the present disclosure pertains.

The first semiconductor layer 210 may include a first channel region 210C overlapping with the first gate electrode 240, a first source region 210S connected to the first source electrode 220, and a first drain region 210D connected to the first drain electrode 230.

The second gate insulating layer 60 may be disposed on the first semiconductor layer 210. The second gate insulating layer 60 may be disposed only on the first semiconductor layer 210. For example, the second gate insulating layer 60 may be disposed only on the first semiconductor layer 210 to overlap with the first semiconductor layer 210. The width of the second gate insulating layer 60 may be smaller than the width of the first semiconductor layer 210. In addition, the width of the second gate insulating layer 60 may be greater than the width of the first gate electrode 240. Although the second gate insulating layer 60 is illustrated as being formed only on the first semiconductor layer 210 in FIGS. 5 and 6C, embodiments of the present disclosure are not limited thereto. For example, the second gate insulating layer 60 extends further to be disposed even on the second gate electrode 340 disposed in the non-display area NDA.

The second gate insulating layer 60 may include at least one of a silicon oxide ($SiO_x$)-based material or a silicon nitride ($SiN_x$)-based material. The second gate insulating layer 60 may have a single-layer structure or a multilayer structure.

The first gate electrode 240 of the first thin film transistor 200 may be disposed on the second gate insulating layer 60. The first gate electrode 240 may overlap with the first semiconductor layer 210 under the condition that the second gate insulating layer 60 is interposed between the first gate electrode 240 and the first semiconductor layer 210. The first gate electrode 240 may include a conductive material. For example, the first gate electrode 240 may include metal such as aluminum (Al), chromium (Cr), copper (Cu), titanium (Ti), molybdenum (Mo), tungsten (W), or an alloy thereof. In addition, the first gate electrode 240 may be formed by a single layer or multiple layers.

For example, when the first gate electrode 240 is formed by multiple layers, as illustrated in FIGS. 5 and 6C, the first gate electrode 240 may include a first-gate lower electrode 241 and a first-gate upper electrode 242. The first-gate lower electrode 241 may be disposed on the second gate insulating layer 60, and the first-gate upper electrode 242 may be disposed on the first-gate lower electrode 241. The first-gate lower electrode 241 may include a metal layer of titanium (Ti) or a metal layer of a titanium (Ti) alloy. For example, when the first-gate lower electrode 241 includes a metal layer of a titanium (Ti) alloy, the first-gate lower electrode 241 may be constituted by a metal layer of a molybdenum-titanium alloy (MoTi). On the other hand, the first-gate upper electrode 242 may be made of one of molybdenum (Mo), copper (Cu), aluminum (Al), chromium (Cr), gold (Au), nickel (Ni), neodymium (Nd), or an alloy thereof. When viewed in a cross-sectional view, the width of the first-gate lower electrode 241 may be greater than the width of the first-gate upper electrode 242. In addition, the width of the second gate insulating layer 60 may be greater than the width of the first-gate lower electrode 241.

Figure 6D:
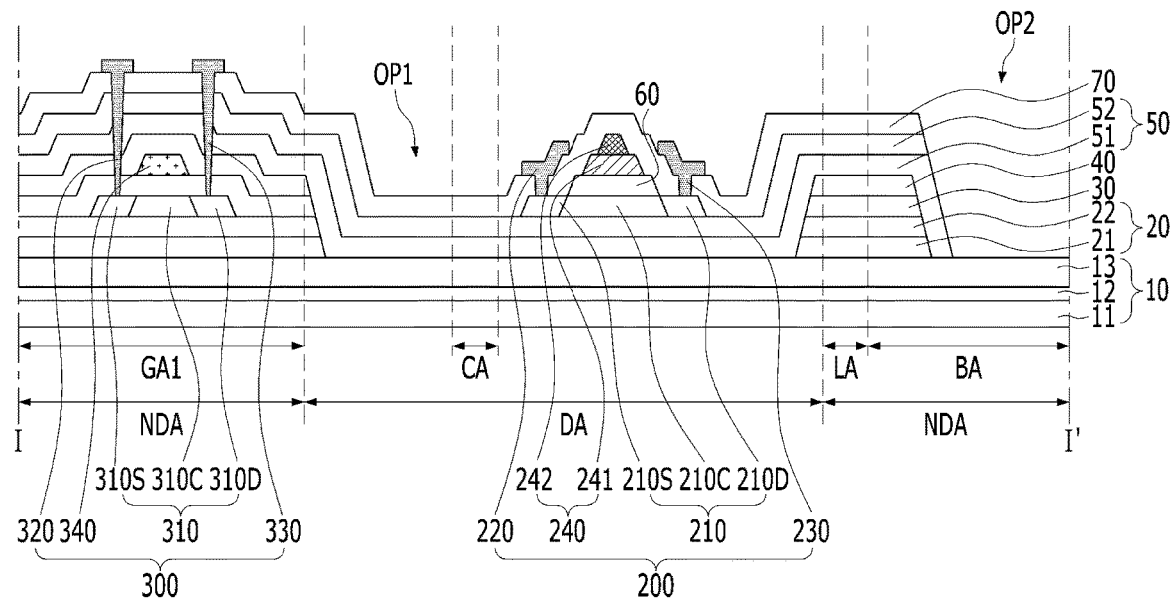

Referring to FIGS. 5 and 6D, the second interlayer insulating layer 70 may be formed on the first gate electrode 240, the first semiconductor layer 210, and the second-buffer upper layer 52 of the second buffer layer 50. The second interlayer insulating layer 70 may include at least one of a silicon oxide ($SiO_x$)-based material or a silicon nitride ($SiN_x$)-based material. The second interlayer insulating layer 70 may have a single-layer structure or a multilayer structure.

Referring to FIG. 6D, contact holes may be formed to expose the first semiconductor layer 210 of the first thin film transistor 200 by etching the second interlayer insulating layer 70 in the display area DA. For example, contact holes may be formed through the second interlayer insulating layer 70 in order to expose the first source region 210S and the first drain region 210D in the first semiconductor layer 210, respectively.

In addition, contact holes may be formed to expose the second semiconductor layer 310 by etching the second interlayer insulating layer 70, the second buffer layer 50, the second interlayer insulating layer 40 and the first gate insulating layer 30 in the gate driving area GA of the non-display area NDA. For example, contact holes may be formed through the second interlayer insulating layer 70, the second buffer layer 50, the second interlayer insulating layer 40 and the first gate insulating layer 30 in order to expose the second source region 310S and the second drain region 310D in the second semiconductor layer 310.

Referring to FIG. 6D, the second interlayer insulating layer 70 and the second buffer layer 50 disposed in the bending area BA of the non-display area NDA may be removed to expose the substrate 10. For example, the second buffer layer 50 and the second interlayer insulating layer 70 disposed on the substrate 10 exposed through the second opening OP2 may be removed through an etching process.

As illustrated in FIG. 6D, the etching process for forming the contact holes exposing the first semiconductor layer 210 disposed in the display area DA and the second semiconductor layer 310 disposed in the gate driving area BA of the non-display area NDA may be carried out simultaneously with the etching process for removing the second interlayer insulating layer 70 and the second buffer layer 50 in order to expose the substrate 10 corresponding to the bending area BA of the non-display area NDA. As the etching process for forming the contact holes exposing the first semiconductor layer 210 disposed in the display area DA and the second semiconductor layer 310 disposed in the gate driving area BA of the non-display area NDA and the etching process for forming the second opening OP2 exposing the substrate 10 in the bending area BA of the non-display area NDA are simultaneously carried out, the process for manufacturing the display panel may be simplified. In addition, there are effects of reducing the manufacturing time and costs of the display panel.

Referring to FIGS. 5 and 6D, the first source electrode 220, the first drain electrode 230, the second source electrode 320 and the second drain electrode 330 may be thrilled on the second interlayer insulating layer 70.

The second source electrode 320 and the second drain electrode 330 in the second thin film transistor 300 may be connected to the second semiconductor layer 310 exposed through respective contact holes extending through the second interlayer insulating layer 70, the second buffer layer 50, the first interlayer insulating layer 40 and the first gate insulating layer 30 in the gate driving area GA of the non-display area NDA. For example, the second source electrode 320 may be connected to the second source region 310S of the second semiconductor layer 310 via the contact hole formed to extend through the second interlayer insulating layer 70, the second buffer layer 50, the first interlayer insulating layer 40 and the first gate insulating layer 30. On the other hand, the second drain electrode 330 may be connected to the second drain region 310D of the second semiconductor layer 310 via the contact hole formed to extend through the second interlayer insulating layer 70, the second buffer layer 50, the first interlayer insulating layer 40 and the first gate insulating layer 30.

Meanwhile, the first source electrode 220 and the first drain electrode 230 in the first thin film transistor 200 may be connected to the first semiconductor layer 210 exposed via respective contact holes of the second interlayer insulating layer 70 in the display area DA. For example, the first source electrode 220 may be connected to the first source region 210S of the first semiconductor layer 210 via the contact hole formed to extend through the second interlayer insulating layer 70. On the other hand, the first drain electrode 230 may be connected to the first drain region 210D of the first semiconductor layer 210 via the contact hole formed to extend through the second interlayer insulating layer 70.

The first source electrode 220, the first drain electrode 230, the second source electrode 320 and the second drain electrode 330 may be made of the same material, and may be disposed on the same layer. In addition, the first source electrode 220, the first drain electrode 230, the second source electrode 320 and the second drain electrode 330 may have the same stacked structure, and may be formed by a single layer or multiple layers made of one of molybdenum (Mo), copper (Cu), titanium (Ti), aluminum (Al), chromium (Cr), gold (Au), nickel (Ni), neodymium (Nd), or an alloy thereof. For example, when the first source electrode 220, the first drain electrode 230, the second source electrode 320 and the second drain electrode 330 have a multilayer structure, each of the first source electrode 220, the first drain electrode 230, the second source electrode 320 and the second drain electrode 330 may be formed by triple layers. When each of the first source electrode 220, the first drain electrode 230, the second source electrode 320 and the second drain electrode 330 is formed by triple layers, each of lower and upper layers thereof may be constituted by a metal layer of aluminum (Al). In this case, an intermediate layer interposed between the lower and upper layers may be constituted by a metal layer of titanium (Ti).

Figure 6E:
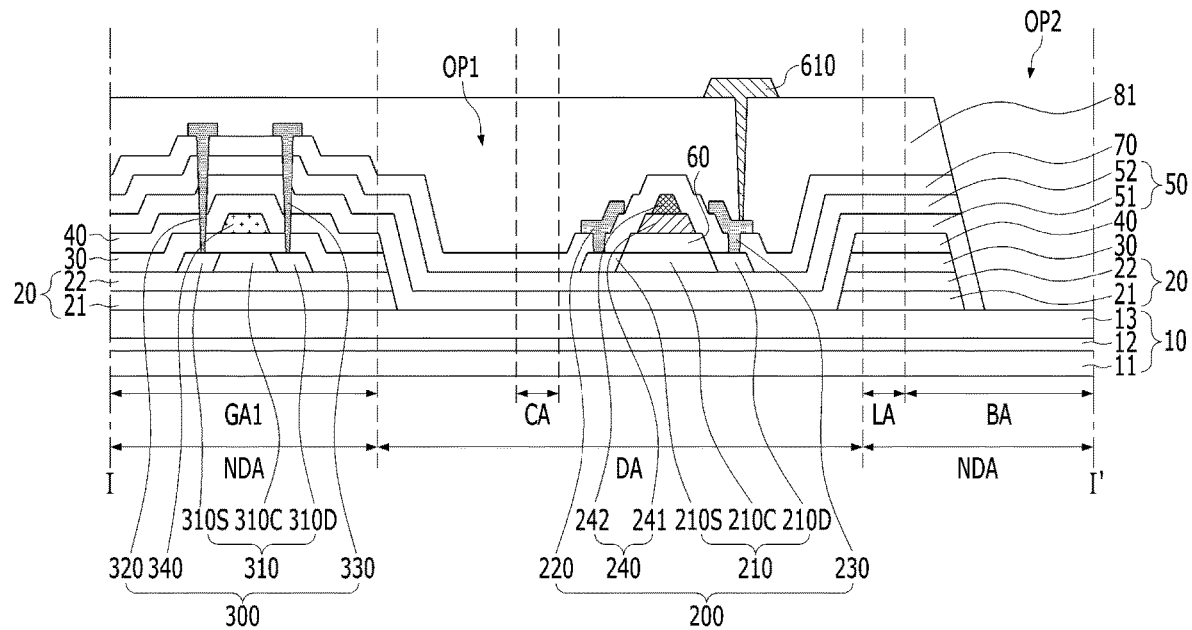

Referring to FIG. 6E, a first passivation layer 81 of the passivation layer 80 may be formed on the first source electrode 220, the first drain electrode 230, the second source electrode 320, the second drain electrode 330 and the second interlayer insulating layer 70. In addition, the first passivation layer 81 may also be formed on the substrate 10 exposed through the second opening OP2 in the bending area BA.

As illustrated in FIG. 5, the passivation layer 80 may include the first passivation layer 81 and a second passivation layer 82 disposed on the first passivation layer 81. The first passivation layer 81 may be a single layer or multiple layers constituted by at least one of an inorganic material or an organic material. When the first passivation layer 81 includes an inorganic material, the inorganic material may be a silicon oxide ($SiO_x$)-based material or a silicon nitride ($SiN_x$)-based material. On the other hand, when the first passivation layer 81 includes an organic material, the organic material may be an organic material such as acryl resin, epoxy resin, phenolic resin, polyamide resin, or polyimide resin.

In addition, referring to FIGS. 5 and 6E, a contact hole may be formed to expose the first drain electrode 230 by etching the first passivation layer 81 disposed in the display area DA. For example, a contact hole may be formed to extend through the first passivation layer 81, for exposure of the first drain electrode 230. Alternatively, a contact hole may be formed to extend the first passivation layer 81, for exposure of the first source electrode 220.

The first passivation layer 81 disposed at the second opening OP2 in the bending area BA may be removed through an etching process. The process for etching the first passivation layer 81 disposed at the second opening OP2 in the bending area BA may be carried out simultaneously with the etching process for forming the contact hole exposing the first drain electrode 230. For example, the process for exposing the substrate 10 by removing the first passivation layer 81 disposed at the second opening OP2 in the bending area BA and the process for forming the contact hole exposing the first drain electrode 230 may be carried out using the same process. Of course, embodiments of the present disclosure are not limited to the above-described condition, and the first passivation layer 81 formed at the second opening OP2 may not be removed. For example, the first passivation layer 81 may be disposed to contact the substrate 10 exposed through the second opening OP2.

Referring to FIG. 6E, the bending area BA may include the second opening OP2 exposing the substrate 10. For example, the second opening OP2 in the bending area BA may expose the second substrate 13 of the substrate 10.

Referring to FIG. 6E, the auxiliary electrode 610 may be formed on the first passivation layer 81 of the passivation layer 80.

The auxiliary electrode 610 may be connected to the first drain electrode 230 exposed through the contact hole of the first passivation layer 81. Accordingly, the auxiliary electrode 610 may be electrically connected to the first thin film transistor 200. For example, the auxiliary electrode 610 may be connected to the first drain electrode 230 via the contact hole formed through the first passivation layer 81. In addition, the first drain electrode 230 may be connected to the first semiconductor layer 210 via the contact hole thrilled through the second interlayer insulating layer 70.

The auxiliary electrode 610 may be formed by a single layer or multiple layers made of one of molybdenum (Mo), copper (Cu), titanium (Ti), aluminum (Al), chromium (Cr), gold (Au), nickel (Ni), neodymium (Nd), or an alloy thereof. The auxiliary electrode 610 may be made of the same material as the first drain electrode 230. In addition, the auxiliary electrode 610 may be constituted by the same stacked structure as the first drain electrode 230.

Figure 6F:
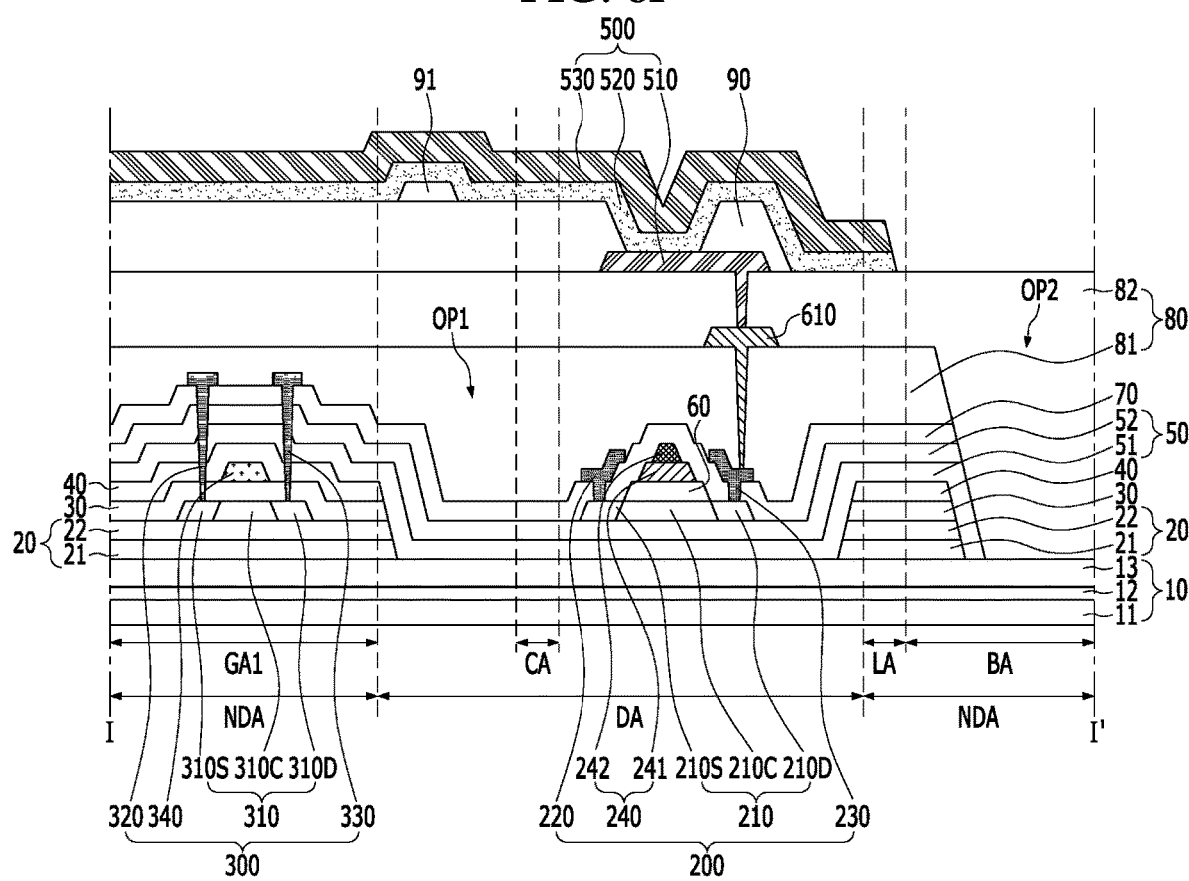

Referring to FIGS. 5 and 6F, the second passivation layer 82 may be formed on the auxiliary electrode 610 and the first passivation layer 81. The second passivation layer 82 may be made of an organic material such as acryl resin, epoxy resin, phenolic resin, polyamide resin, or polyimide resin. The second passivation layer 82 may include a contact hole for exposing the auxiliary electrode 610.

A first electrode 510 of the light emitting element 500 may be formed on the second passivation layer 82 of the passivation layer 80. The first electrode 510 may be connected to the auxiliary electrode 610 expose through the contact hole of the second passivation layer 82. Accordingly, the first electrode 510 may be electrically connected to the first thin film transistor 200 via the auxiliary electrode 610. For example, the first electrode 510 is connected to the auxiliary electrode 610 via the contact hole of the second passivation layer 82, and the auxiliary electrode 610 may be connected to the first drain electrode 230 of the first thin film transistor 200 via the contact hole of the first passivation layer 81. Of course, embodiments of the present disclosure a not limited to the above-described conditions.

Referring to FIG. 6F, the emitting element 500 of each sub-pixel SP may be electrically connected to the first thin film transistor 200 of the sub-pixel SP. For example, the first electrode 510 of the sub-pixel SP may be electrically connected to the first drain electrode 230 of the first thin film transistor 200 via the auxiliary electrode 610. Accordingly, the first electrode 510 of the sub-pixel SP may be electrically connected to the first thin film transistor 200.

The first electrode 510 may be formed to have a multi-layer structure including a transparent conductive film and an opaque conductive film having high reflection efficiency. The transparent conductive film may be made of a material having a relatively great work fun value such as indium tin oxide (ITO) or indium zinc oxide (IZO). The opaque conductive film may be constituted by a single-layer structure or a multilayer structure including aluminum (Al), silver (Ag), copper (Cu), lead (Pb), molybdenum (Mo), titanium (Ti) or an alloy thereof. For example, the first electrode 510 may be formed through sequential formation of a transparent conductive film, an opaque conductive film and a transparent conductive film. Of course, embodiments of the present disclosure are not limited to the above-described condition. For example, a transparent conductive film and an opaque conductive film may be sequentially formed.

The display apparatus according to the exemplary embodiment of the present disclosure is a top emission display apparatus and, as such, the first electrode 510 may be an anode. When the display apparatus is of a bottom emission type, the first electrode 510 disposed on the passivation layer 80 may be a cathode.

The light emitting element 500 of each sub-pixel SP may be independently driven. For example, the first electrode 510 of each SUB-pixel SP may be insulated from the first electrodes 510 of sub-pixels SP disposed adjacent to the sub-pixel SP. Edges of the first electrode 510 in each sub-pixel SP may be covered by the bank layer 90. The bank layer 90 may be disposed on the passivation layer 80. In each sub-pixel SP, the light emitting layer 520 and the second electrode 530 may be stacked on the first electrode 510 exposed through the bank layer 90. The bank layer 90 may include an insulating material. For example, the bank layer 90 may include an organic insulating material. The bank layer 90 may include a material identical to or different from that of the passivation layer 80. The bank layer 90 may define a light emission area of the display apparatus and, as such, may be referred to as a "pixel definition film". A spacer 91 may further be disposed on the bank layer 90. The spacer 91 may be made of the same material as the bank layer 90.

The light emitting layer 520 of the light emitting element 500 may further be disposed on the first electrode 510. The light emitting layer 520 may be formed on the first electrode 510 in an order of a hole layer HL, a light emitting material layer EML and an electron layer EL or a reversed order thereof.

At least a portion of the light emitting layer 520 in each sub-pixel SP may extend over the bank layer 90. For example, the hole layer HL and the electron layer EL in each sub-pixel SP may be connected to the hole layers HL and the electron layers EL in sub-pixels SP disposed adjacent to the sub-pixel SP. The light emitting material layer EML of each sub-pixel SP may be spaced apart from the light emitting material layers EML of the sub-pixels SP disposed adjacent to the sub-pixel SP. The second electrode 530 of each sub-pixel SP may extend over the bank layer 90. For example, the second electrode 530 of each sub-pixel SP may be connected to the second electrodes 530 of the sub-pixels SP disposed adjacent to the sub-pixel SP.

An encapsulator for suppressing penetration of moisture may be further disposed on the second electrode 530. The encapsulator may include a first encapsulation layer, a second encapsulation layer and a third encapsulation layer. The second encapsulation layer may include a material different from those of the first and third encapsulation layers. For example, each of the first and third encapsulation layers may be an inorganic insulating film made of an inorganic insulating material, whereas the second encapsulation layer may be an organic insulating film made of an organic insulating material. The first encapsulation layer of the encapsulator may be disposed on the second electrode 530. The second encapsulation layer may be disposed on the first encapsulation layer. In addition, the third encapsulation layer may be disposed on the second encapsulation layer.

The first and third encapsulation layers of the encapsulator may be made of an inorganic material such as silicon nitride ($SiN_x$) or silicon oxide ($SiO_x$). The second encapsulation layer of the encapsulator may be made of an organic material such as acryl resin, epoxy resin, phenolic resin, polyamide resin, or polyimide resin.

A display panel according to an exemplary embodiment of the present disclosure may include a substrate including a display area including a plurality of sub-pixels, and a gate driving area including a gate driving circuit, a first buffer layer contacting the substrate in the gate driving area, a second thin film transistor disposed in the gate driving area while including a second semiconductor layer made of a second semiconductor, a second buffer layer disposed at a first opening exposing the substrate in the display area while contacting the substrate, and a first thin film transistor disposed at the first opening in the display area while including a first semiconductor layer made of a first semiconductor different from the second semiconductor.

In accordance with an embodiment of the present disclosure, the first semiconductor may be an oxide semiconductor, and the second semiconductor may be a polysilicon semiconductor.

In accordance with an embodiment of the present disclosure, the substrate may further include a bending area in which the substrate is bent.

In accordance with an embodiment of the present disclosure, the bending area may include a second opening exposing the substrate.

In accordance with an embodiment of the present disclosure, the display panel may further include a passivation layer disposed on the first thin film transistor and the second thin film transistor. The passivation layer may contact the substrate exposed through the second opening.

In accordance with an embodiment of the present disclosure, the second buffer layer may be disposed on the first buffer layer in the gate driving area.

In accordance with an embodiment of the present disclosure, the first semiconductor layer may contact the second buffer layer, and the second semiconductor layer may contact the first buffer layer.

In accordance with an embodiment of the present disclosure, the first buffer layer may not be disposed between the first semiconductor layer and the substrate.

In accordance with another aspect of the present disclosure, a display panel may include a substrate including a display area including a plurality of sub-pixels, and a gate driving area including a gate driving circuit, a first buffer layer disposed in the gate driving area while contacting the substrate, a second thin film transistor disposed in the gate driving area, the second thin film transistor including a second semiconductor layer made of a polysilicon semiconductor, a second gate electrode overlapping with the second semiconductor layer under a condition that a first gate insulating layer is interposed between the second gate electrode and the second semiconductor layer, a second source electrode connected to the second semiconductor layer, and a second drain electrode connected to the second semiconductor layer, a first interlayer insulating layer disposed in the gate driving area while being disposed on the second gate electrode, a second buffer layer disposed in the gate driving area and the display area while contacting the substrate in the display area, and a first thin film transistor disposed in the display area, the first thin film transistor including a first semiconductor layer made of an oxide semiconductor, a first gate electrode overlapping with the first semiconductor layer under a condition that a second gate insulating layer is interposed between the first gate electrode and the first semiconductor layer, a first source electrode connected to the first semiconductor layer, and a first drain electrode connected to the first semiconductor layer.

In accordance with an embodiment of the present disclosure, the second buffer layer may be disposed on the first interlayer insulating layer in the gate driving area, and the first buffer layer may be disposed beneath the first interlayer insulating layer in the gate driving area.

In accordance with an embodiment of the present disclosure, the second buffer layer may contact the first interlayer insulating layer in the gate driving area.

In accordance with an embodiment of the present disclosure, the first semiconductor layer may contact the second buffer layer, and the second semiconductor layer may contact the first buffer layer.

In accordance with an embodiment of the present disclosure, the first buffer layer, the first gate insulating layer and the first interlayer insulating layer may not be disposed between the first semiconductor layer and the substrate.

In accordance with embodiments of the present disclosure, it may be possible to enhance optical transmissivity of the camera area CA of the display area DA in the display panel through removal of a plurality of insulating layers disposed in the camera area CA even in a structure in which a camera is disposed in the display area DA. Accordingly, it may be possible to enhance recognizability of the camera disposed in the display area of the display panel.

In addition, in accordance with embodiments of the present disclosure, the camera is disposed to correspond to the display area and, as such, it may be possible to reduce a bezel area in a display apparatus.

Furthermore, in accordance with embodiments of the present disclosure, for an enhancement in optical transmissivity of the camera area CA, the etching process for formation of the fist opening exposing the substrate in the display area is carried out simultaneously with the etching process for formation of the second opening exposing the substrate in the bending area BA of the non-display area NDA, without being separately carried out. Accordingly, the manufacturing process for the display panel may be simplified. As such, the manufacturing time and costs of the display panel may be reduced.

In addition, in accordance with embodiments of the present disclosure, the heat dissipation film disposed between the back surface of the display panel and the camera may include a hole disposed to correspond to the camera area CA. An enhancement in optical transmissivity may be achieved by the hole of the heat dissipation film formed to correspond to the camera area CA.

Effects according to embodiments of the present disclosure are not limited to the above contents, and more various effects may be included in embodiments of the present disclosure.

Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the present disclosure.

What is claimed is:
1. A display panel comprising:
 a substrate comprising a display area that includes a plurality of sub-pixels, and a non-display area disposed adjacent to the display area, the non-display area including a gate driving area comprising a gate driving circuit and a bending area disposed outside the display area and the gate driving area;
a first buffer layer contacting the substrate in the gate driving area, the first buffer layer including a first lower opening in the display area and a second lower opening in the bending area;
a second buffer layer contacting the display area of the substrate exposed by the first lower opening of the first buffer layer, the second buffer layer including an upper opening in the bending area;
a first thin film transistor disposed on the second buffer layer in the display area, the first thin film transistor comprising a first semiconductor layer made of a first semiconductor; and
a second thin film transistor disposed on the first buffer layer in the gate driving area, the second thin film transistor comprising a second semiconductor layer made of a second semiconductor different from the first semiconductor,
wherein the first thin film transistor overlaps the first lower opening of the first buffer layer,
wherein the upper opening is disposed in the second lower opening, such that an end of the first buffer layer disposed in the bending area is covered by the second buffer layer.

2. The display panel according to claim 1, wherein the first semiconductor is an oxide semiconductor, and the second semiconductor is a polysilicon semiconductor.

3. The display panel according to claim 1, wherein in which the substrate is bent in the bending area.

4. The display panel according to claim 3, wherein the second opening exposes the bending area of the substrate.

5. The display panel according to claim 4, further comprising:
a first passivation layer disposed on the first thin film transistor and the second thin film transistor; and
a second passivation layer disposed on the first passivation layer,
wherein the first passivation layer includes a hole disposed in the upper opening in the bending area, and,
wherein the second passivation layer contacts the bending area of the substrate exposed y the hole of the first passivation layer.

6. The display panel according to claim 5, further comprising:
a light emitting element comprising a first electrode, a light emitting layer, and a second electrode, the light emitting element disposed on the second passivation layer,
wherein the light emitting element is electrically connected to the first thin film transistor.

7. The display panel according to claim 1, wherein the second buffer layer is disposed on the first buffer layer in the gate driving area.

8. The display panel according to claim 1, wherein:
the first semiconductor layer contacts the second buffer layer; and
the second semiconductor layer contacts the first buffer layer.

9. The display panel according to claim 8, wherein the first buffer layer is not disposed between the first semiconductor layer and the substrate.

10. The display panel according to claim 1, wherein the display area includes a camera area corresponding to a camera disposed at a back surface of the substrate, the camera area overlapping with the first lower opening.

11. A display panel comprising:
a substrate comprising a display area that includes a plurality of sub-pixels, and a non-display area disposed adjacent to the display area, the non-display area including a gate driving area comprising a gate driving circuit and a bending area disposed outside the display area and the gate driving area;
a first buffer layer disposed in the gate driving area, the first buffer layer contacting the substrate;
a first interlayer insulating layer disposed in the gate driving area, the first interlayer insulating layer disposed on the first buffer layer;
a second buffer layer contacting the substrate in the display area, the second buffer layer disposed on the first interlayer insulating layer in the gate driving area;
a first thin film transistor disposed on the second buffer layer in the display area, the first thin film transistor comprising a first semiconductor layer made of an oxide semiconductor, a first gate electrode overlapping with the first semiconductor layer under a condition that a first gate insulating layer is interposed between the first gate electrode and the first semiconductor layer, a first source electrode connected to the first semiconductor layer, and a first drain electrode connected to the first semiconductor layer; and
a second thin film transistor disposed of the first buffer layer in the gate driving area, the second thin film transistor comprising a second semiconductor layer made of a polysilicon semiconductor, a second gate electrode overlapping with the second semiconductor layer under a condition that a second gate insulating layer is interposed between the second gate electrode and the second semiconductor layer, a second source electrode connected to the second semiconductor layer, and a second drain electrode connected to the second semiconductor layer,
wherein the second buffer layer is disposed at a first opening penetrating the first buffer layer, the second gate insulating layer and the first interlayer insulating layer in the display area, and
wherein the second buffer layer includes a hole disposed at a second opening penetrating the first buffer layer, the second gate insulating layer and the first interlayer insulating layer in the bending area, such that ends of the first buffer layer, the second gate insulating layer and the first interlayer insulating layer disposed in the bending area are covered by the second buffer layer.

12. The display panel according to claim 11, wherein the second gate electrode is disposed between the second gate insulating layer and the first interlayer insulating layer.

13. The display panel according to claim 12, wherein the second buffer layer contacts the first interlayer insulating layer in the gate driving area.

14. The display panel according to claim 11, wherein:
the first semiconductor layer contacts the second buffer layer; and
the second semiconductor layer contacts the first buffer layer.

15. The display panel according to claim 14, wherein the first buffer layer, the first gate insulating layer, and the first interlayer insulating layer are not disposed between the first semiconductor layer and the substrate.

16. The display panel according to claim 11, wherein the display area includes a camera area corresponding to a camera disposed at a back surface of the substrate, the camera area overlapping with the first opening.

17. The display panel according to claim 11, further comprising:

a second interlayer insulating layer formed on the first gate electrode, the first semiconductor layer, and the second buffer layer.

18. A display apparatus, comprising:
a cover substrate;
the display panel according to claim 1;
a flexible film;
an integrated controller;
a camera; and
a circuit board.

19. The display apparatus according to claim 18, further comprising:
a heat dissipation film disposed at a back surface of the display panel.

* * * * *